(12) United States Patent
Moden et al.

(10) Patent No.: US 6,297,960 B1
(45) Date of Patent: Oct. 2, 2001

(54) HEAT SINK WITH ALIGNMENT AND RETAINING FEATURES

(75) Inventors: Walter L. Moden; David J. Corisis, both of Meridian; Larry D. Kinsman; Leonard E. Mess, both of Boise, all of ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/344,284

(22) Filed: Jun. 30, 1999

Related U.S. Application Data

(60) Provisional application No. 60/091,156, filed on Jun. 30, 1998.

(51) Int. Cl.[7] .................................................... H05K 7/20
(52) U.S. Cl. ........................... 361/719; 257/724; 361/735; 361/784
(58) Field of Search .................................. 174/16.3, 252; 165/80.3, 185; 257/722–724, 718, 719, 726, 727; 361/735, 790, 690, 707, 702–705, 711, 715–719, 721, 722, 784

(56) References Cited

U.S. PATENT DOCUMENTS

| | | |
|---|---|---|
| 3,648,113 * | 3/1972 | Rathjen . |
| 3,999,105 * | 12/1976 | Archey . |
| 4,143,456 | 3/1979 | Inoue . |
| 4,264,917 | 4/1981 | Ugon . |
| 4,300,153 | 11/1981 | Hayakawn et al. . |
| 4,323,914 | 4/1982 | Berndlmaier et al. . |
| 4,338,652 * | 7/1982 | Romanczuk . |
| 4,358,552 | 11/1982 | Shinohara et al. . |
| 4,507,675 | 3/1985 | Fujii et al. . |
| 4,603,344 * | 7/1986 | Trommer . |
| 4,642,671 | 2/1987 | Rohsler et al. . |
| 4,801,998 | 1/1989 | Okuaki . |
| 4,862,245 | 8/1989 | Pashby et al. . |
| 4,931,852 | 6/1990 | Brown et al. . |
| 4,961,107 | 10/1990 | Geist et al. . |
| 4,984,059 | 1/1991 | Kubota et al. . |
| 5,016,138 * | 5/1991 | Woodman . |
| 5,051,275 | 9/1991 | Wong . |
| 5,101,465 | 3/1992 | Murphy . |
| 5,108,955 | 4/1992 | Ishida et al. . |
| 5,144,747 | 9/1992 | Eichelberger . |
| 5,173,764 | 12/1992 | Higgins, III . |
| 5,184,208 | 2/1993 | Sakuta et al. . |
| 5,194,930 | 3/1993 | Papathomas et al. . |
| 5,218,759 | 6/1993 | Juskey et al. . |
| 5,222,014 * | 6/1993 | Lin . |
| 5,252,853 | 10/1993 | Michii . |
| 5,286,679 | 2/1994 | Farnworth et al. . |
| 5,304,842 | 4/1994 | Farnworth et al. . |
| 5,305,185 * | 4/1994 | Samarov . |
| 5,311,060 | 5/1994 | Rostoker et al. . |
| 5,344,795 | 9/1994 | Hashemi et al. . |
| 5,379,186 | 1/1995 | Gold et al. . |

(List continued on next page.)

FOREIGN PATENT DOCUMENTS

| | | |
|---|---|---|
| 52-77684 | 6/1977 | (JP) . |
| 55-128835 | 10/1980 | (JP) . |
| 56-4241 | 1/1981 | (JP) . |
| 60-94744 | 5/1985 | (JP) . |
| 60-178651 | 9/1985 | (JP) . |
| 62-109326 | 5/1987 | (JP) . |
| 62-115834 | 5/1987 | (JP) . |
| 62-261133 | 11/1987 | (JP) . |
| 2-306639 | 12/1990 | (JP) . |
| 4-157758 | 5/1992 | (JP) . |

*Primary Examiner*—Gerald Tolin
(74) *Attorney, Agent, or Firm*—TraskBritt

(57) ABSTRACT

An apparatus for providing heat sinks or heat spreaders for stacked semiconductor devices. Alignment apparatus may be included for the alignment of the stacked semiconductor devices. An enclosure may be used as the heat sink or heat spreader.

34 Claims, 9 Drawing Sheets

U.S. PATENT DOCUMENTS

| | | |
|---|---|---|
| 5,394,303 | 2/1995 | Yamaji . |
| 5,434,105 | 7/1995 | Liou . |
| 5,436,203 | 7/1995 | Lin . |
| 5,440,169 | 8/1995 | Tomita et al. . |
| 5,441,684 | 8/1995 | Lee . |
| 5,450,283 | 9/1995 | Lin et al. . |
| 5,461,255 | 10/1995 | Chan et al. . |
| 5,488,254 | 1/1996 | Nishimura et al. . |
| 5,489,538 | 2/1996 | Rostoker et al. . |
| 5,489,801 | 2/1996 | Blish, II . |
| 5,552,635 | 9/1996 | Kim et al. . |
| 5,598,034 | 1/1997 | Wakefield . |
| 5,604,376 | 2/1997 | Hamburgen et al. . |
| 5,641,997 | 6/1997 | Ohta et al. . |
| 5,652,461 | 7/1997 | Ootssuki et al. . |
| 5,656,857 | 8/1997 | Kishita . |
| 5,659,952 | 8/1997 | Kovac et al. . |
| 5,861,666 * | 1/1999 | Bellaar . |
| 5,866,953 | 2/1999 | Akram et al. . |

* cited by examiner

HEAT SINK WITH ALIGNMENT AND RETAINING FEATURES

CROSS REFERENCES TO RELATED APPLICATION

This application claims the benefit of U.S. Provisional Application No. 60/091,156 filed Jun. 30, 1998.

BACKGROUND OF THE INVENTION

1. Field of the Invention

The present invention relates to an apparatus and method for providing heat sinks or heat spreaders for stacked semiconductor devices.

2. State of the Art

Semiconductor device packages or integrated circuit packages typically contain small integrated circuits on a silicon substrate, or the like, typically referred to as IC chips or die or dice. Such IC dice come in an infinite variety of forms, including, for example, Static Random Access Memory (SRAM) dice, Synchronous DRAM (SDRAM) dice, Static Random Access Memory (SRAM) dice, Sequential Graphics Random Access Memory (SGRAM) dice, flash Electrically Erasable Programmable Read-only Memory (EEPROM) dice, and processor dice.

Packaged IC dice communicate with circuitry external to their packages through lead frames embedded in the packages. These lead frames generally include an assembly of leads that extend into the packages to connect to bond pads on the IC dice through thin wire bonds or other connecting means and extend from the packages to terminate in pins or other terminals that connect to the external circuitry. Exemplary conventional lead frames include paddle-type worebond lead frames, which include a central die support and leads which extend to the perimeter of IC dice and connect to the dice through thin wire bonds, Leads-Over-Chip (LOC) lead frames, having leads which extend over an IC die to attach to and support the die while being electrically connected to the die through wire bonds or other connecting means, and Leads-Under-Chip (LUC) lead frames, having leads which extend under an IC die to attach to and support the die from below while being connected to the die typically through wire bonds.

As with all conductors, the leads in lead frames have an inductance associated with them that increases as the frequency of signals passing through the leads increases. This lead inductance is the result of two interactions: the interaction among magnetic fields created by signal currents flowing to and from an IC die through the leads and magnetic fields created by oppositely directed currents flowing to and from ground (known as "self" inductance).

While lead inductance in IC packages has not traditionally been troublesome because traditionally slow signal frequencies have made the inductance relatively insignificant, the ever-increasing signal frequencies of state of the art electronic systems have made lead inductance in IC packages significant.

In an attempt to eliminate such problems, IC die are being mounted on substrates, such as printed circuit boards, using flip-chip type mounting arrangements. This allows for a high density of mounting arrangements for the IC die in a small area and solder balls or conductive epoxy to be used for the connections between the IC die and the substrate. However, the high density of the IC die on the substrate with increased operating speeds for the IC die cause a great amount of heat to be generated in a small confined area which can be detrimental to the operation of the IC die and substrate as well as surrounding components. Such heat must be dissipated as effectively as possible to prevent damage to the IC die.

Various arrangements have been suggested for use in dissipating heat from IC die on substrates.

U.S. Pat. No. 5,239,200 illustrates an apparatus for cooling an array of integrated circuit chips mounted on a substrate comprising a thermally conductive cooling plate which has a plurality of integral, substantially parallel, closed-end channels for the circulation of a cooling medium therethrough.

U.S. Pat. No. 5,379,191 is directed to an adapter for an integrated circuit chip which may be used in a package arrangement for the chip. The package may include a heat sink or heat spreader on the top of the chip.

U.S. Pat. No. 5,396,403 is directed to a heat sink assembly for a multi-chip module. A thermally conductive plate is bonded to integrated circuit chips on a multi-chip module by indium solder. The plate, in turn, is thermally coupled to a heat sink, such as a finned aluminum member by thermal paste.

U.S. Pat. No. 5,291,064 is directed to a packaged semiconductor device having a wired substrate. A plurality of semiconductor device chips are connected to the wiring substrate by the use of bumps. A heat sink is bonded through a high heat conductive bonding layer to a surface of each of the semiconductor device chips.

However, in each instance of the prior art discussed above, the IC die or semiconductor devices are installed on the substrate in a single layer for the cooling thereof.

A need exists for the cooling of semiconductor devices on a substrate where the substrates and devices are vertically stacked. In such an arrangement the dissipation of the heat from the semiconductor devices is of concern.

SUMMARY OF THE INVENTION

The present invention is directed to an apparatus and method for providing heat sinks or heat spreaders for stacked semiconductor devices. Alignment apparatus may be included for the alignment of the stacked semiconductor devices. An enclosure may be used for the heat sink or heat spreader.

The present invention will be better understood when the drawings are taken in conjunction with the description of the invention hereafter.

DESCRIPTION OF THE INVENTION

Figure 1:
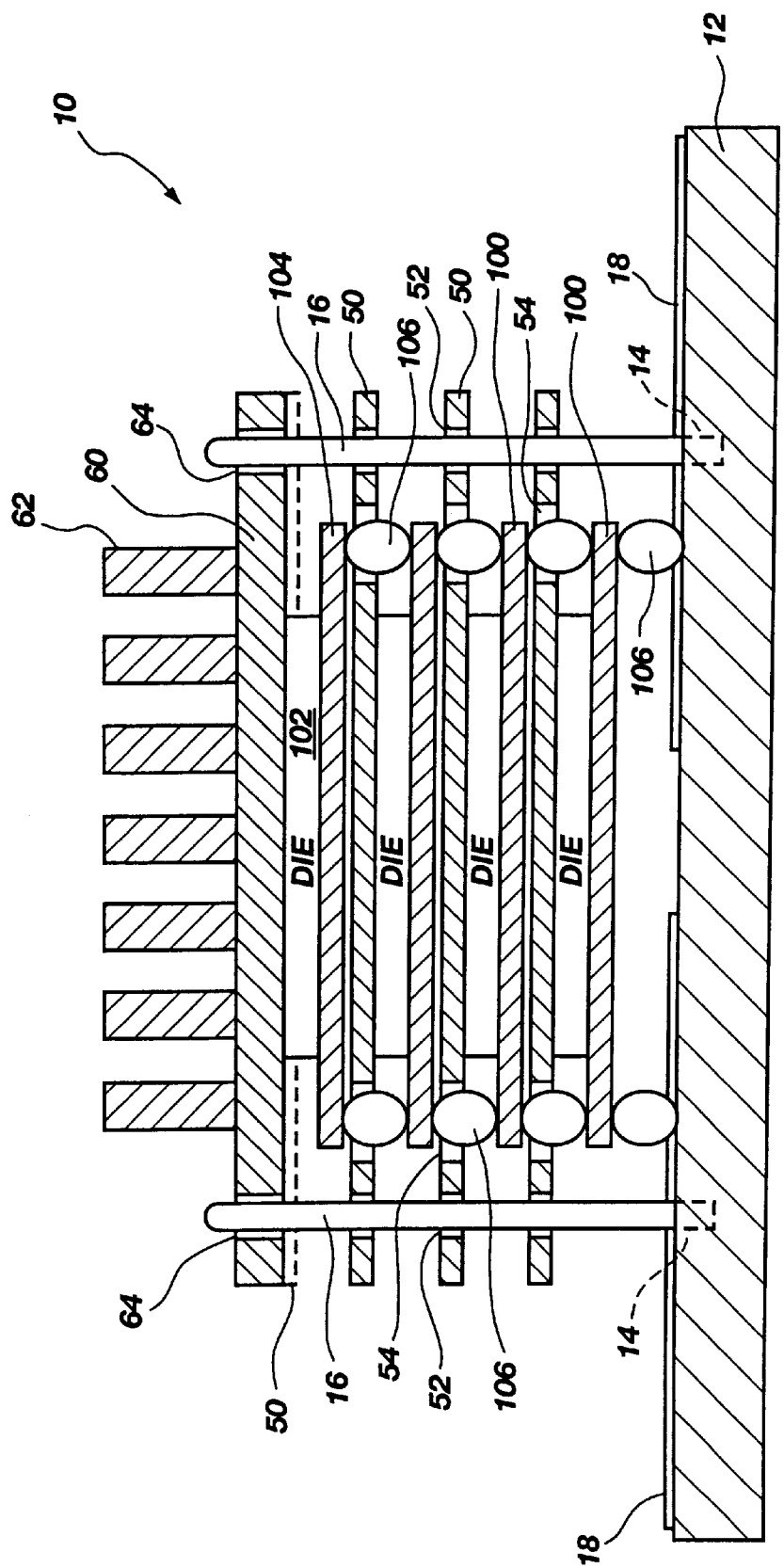
FIG. 1 is a view of a first embodiment of the present invention.

Referring to drawing FIG. 1, a first embodiment 10 of the present invention is shown. The stacked assembly 10 having heat transfer members therewith is illustrated on a substrate 12. The substrate 12 contains a plurality of apertures 14 therein in which the ends of alignment pins 16 are retained, such as using an interference fit, adhesive bonding, threaded connections, etc., the alignment pins 16 may be of any suitable material for use in the aligning of the substrates 12 having sufficient strength and heat conductivity, such as metal, high temperature plastic, etc. The substrate 12 further includes a plurality of circuit traces 18 thereon. Stacked on substrate 12 are a plurality of semiconductor device assemblies 100, each assembly 100 including a semiconductor device 102 mounted on a substrate 104 having a plurality of circuits thereon connected to bond pads on the semiconductor device 102. The substrate further includes a plurality of vias or circuits therein for connection to other adjacent substrates by suitable connections therewith. Such suitable connections may be made by the use of reflowed solder balls 106. As illustrated, located between vertically adjacent assemblies 100 are heat transfer plates 50. The heat transfer plates 50 are formed having apertures 52 therein through which alignment pins 16 extend and elongated slots 54 through which reflowed solder balls 106 extend to make contact with circuits on adjacent substrates 104. The heat transfer plates 50 have a portion thereof in contact with the inactive surface of the semiconductor device 102 of the assembly 100 to transfer the heat therefrom during the operation of the semiconductor device 102. If desired, a thermal grease may be applied to the inactive surface of the semiconductor device 102 and/or the portion of the heat transfer plate 50 which contacts the inactive surface of the semiconductor device 102 to facilitate the transfer of heat from the semiconductor device 102. The elongated slots 54 have sufficient width to allow no electrical contact from the reflowed solder balls 106 extending therethrough. The reflowed solder balls 106 extending from the bottom surface of the substrate 104 of the lowest assembly 100 in the vertical stack electrically and mechanically contact circuit traces 18 on the upper surface of the substrate 12. The alignment apertures 52 in the heat transfer plates 50 are typically circular to closely mate with the alignment pins 16 to align the heat transfer plates 50 on the substrate 12 which, in turn, aligns the assemblies 100 located between the heat transfer plates 50 on the substrate 12.

To provide additional heat transfer from the upper semiconductor device 102 which has no heat transfer plate 50 associated therewith a finned heat transfer member 60 having a plurality of fins 62 thereon and alignment apertures 64 therein is placed into contact with the inactive surface of the semiconductor device 102. The fins 62 may be integrally formed on the heat transfer member 60 or may be secured thereto by any suitable means, such as welding, or the like. The fins 62 may extend in any desired direction of the heat transfer member 60 as desired. The alignment apertures 64 are used to locate the heat transfer member 60 using alignment pins 16 secured to the substrate 12. A thermal grease may be applied to the inactive surface of the semiconductor device 102 and/or a portion of the lower surface of the heat transfer member 60 to aid in heat transfer from the semiconductor device 102. If desired, a heat transfer plate 50 (shown in dotted lines) such as described herein, may be used between upper semiconductor device 102 and heat transfer member 60 for additional heat transfer from the upper semiconductor device 102. If desired, a thermal grease may be used between the upper semiconductor device 102 and the heat transfer plate 50 and the heat transfer member 60.

Figure 2:
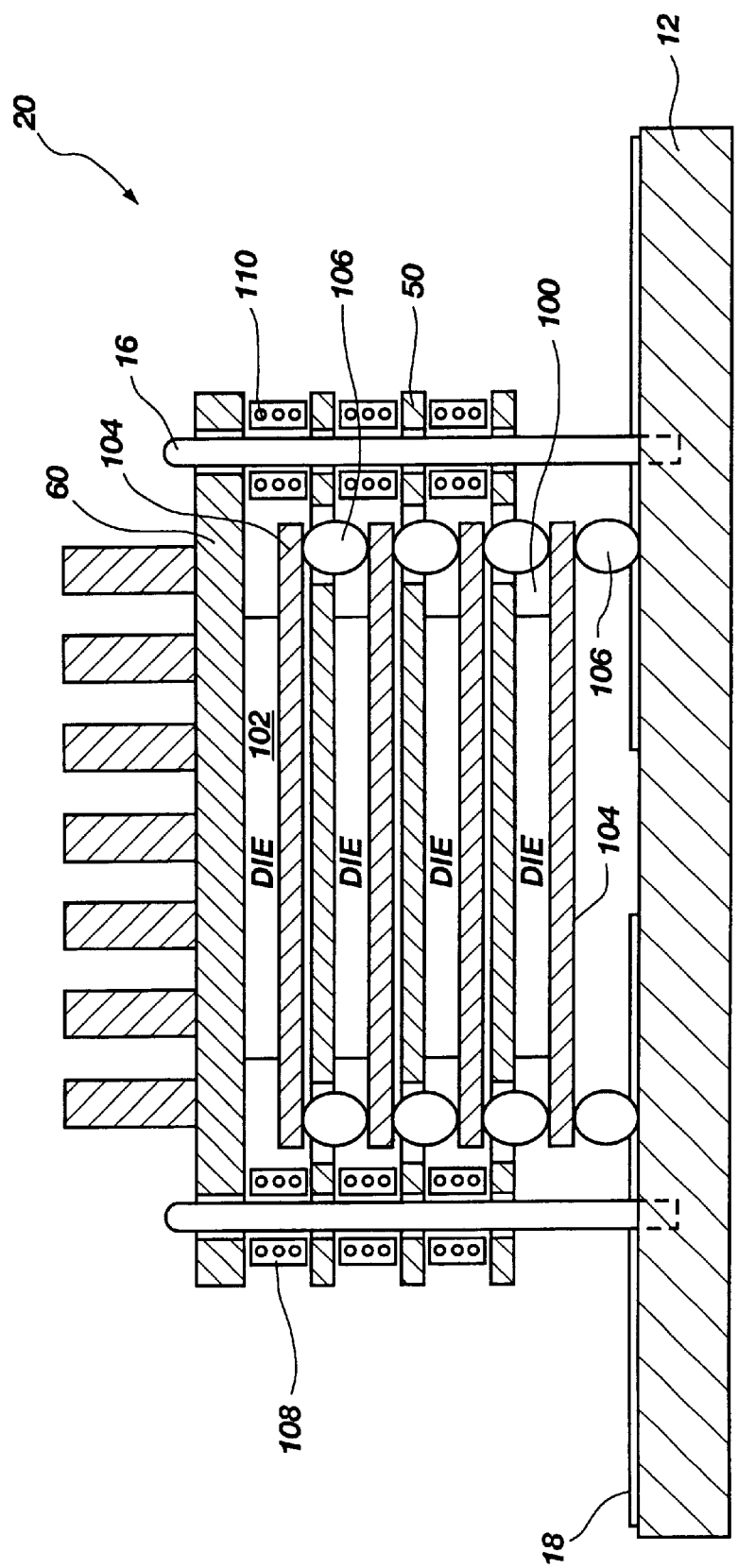
FIG. 2 is a view of a second embodiment of the present invention.

Referring to drawing FIG. 2, a second embodiment 20 of the present invention is illustrated. The second embodiment 20 of the present invention being the same as the first embodiment 10 of the invention except as described hereinafter. A plurality of assemblies 100 are vertically stacked on a substrate 12 having a plurality of circuit traces 18 on the upper surface thereof and alignment pins 16 extending therefrom. The heat transfer plates 50 in the second embodiment of the invention illustrated include a plurality of annular heat conductive members 108 therebetween which are retained on the alignment pins 16 between adjacent heat transfer plates 50 in the plurality of vertically stacked assemblies 100. The annular heat conductive members 108 may be comprised of any suitable material, such as easily deformable metal, a reinforced heat conductive elastomeric material, such as silicon rubber having an annular spirally wound spring 110 therein, etc. The annular heat conductive members 108 helping to transfer heat from one heat transfer plate 50 to an adjacent heat transfer plate 50 and to the heat transfer member 60 to provide an additional heat transfer path for the stacked assemblies 100.

Figure 3:
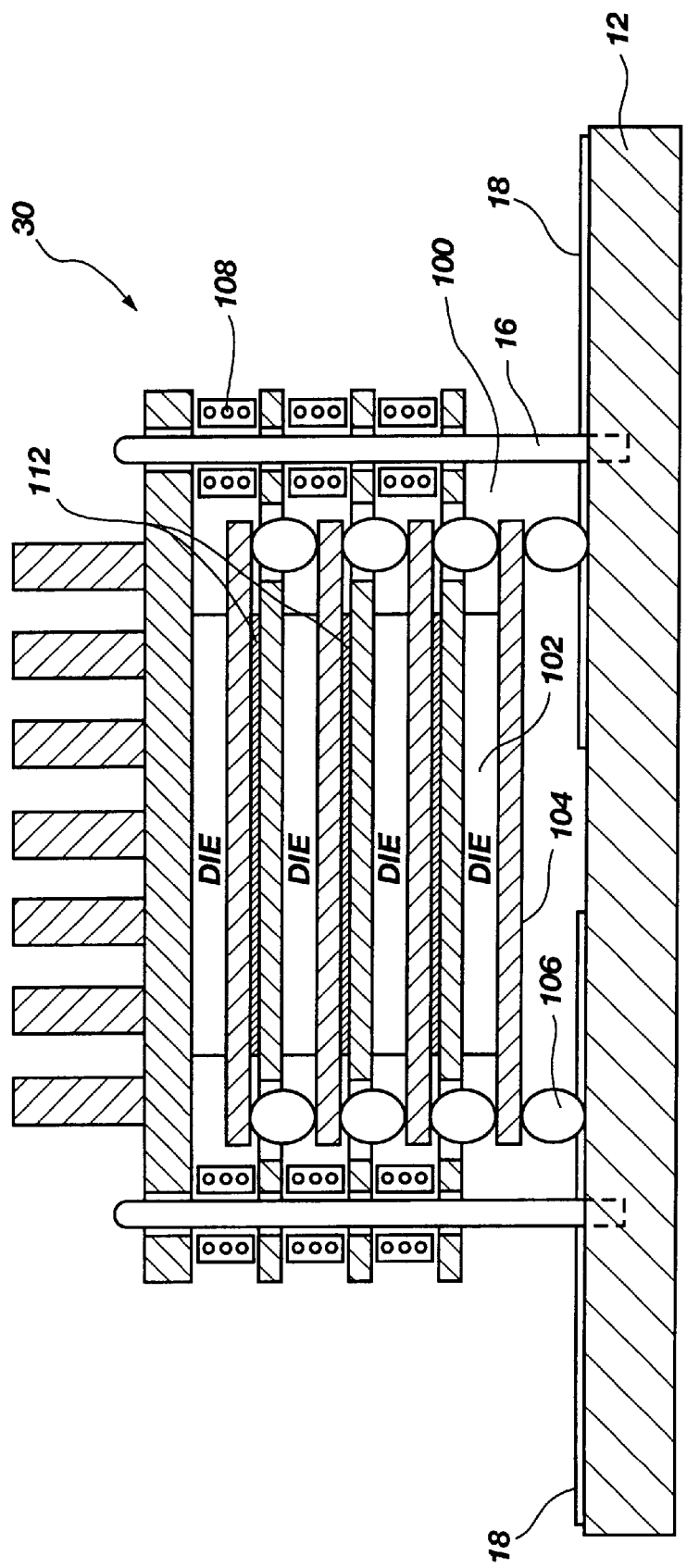
FIG. 3 is a view of a third embodiment of the present invention.

Referring to drawing FIG. 3, a third embodiment 30 of the present invention is illustrated. The third embodiment 30 of the present invention is the same as the first embodiment 10 and second embodiment 20 of the present invention except as described hereinafter. The third embodiment 30 of the present invention includes a plurality of vertically stacked assemblies 100 connected to a substrate 12 being aligned thereon by alignment pins 16. An additional heat transfer path for conducting heat from the individual semiconductor devices 102 connected to substrates 104 is provided by the inclusion of heat transfer spacers 112 located between adjacent heat transfer plates 50 and the bottom of adjacent substrates 104 of assemblies 100. The heat transfer spacers 112 may be of any suitable material, such as an easily deformable metal, silicon rubber, an annular elastomeric member filled with thermal grease, etc. In this manner, heat transfer from the semiconductor device 102 is provided by heat transfer plate 50, heat transfer member 60, annular heat transfer members 108, and heat transfer spacers 112 to the ambient atmosphere and through heat transfer member 60 to the ambient atmosphere.

Figure 4:
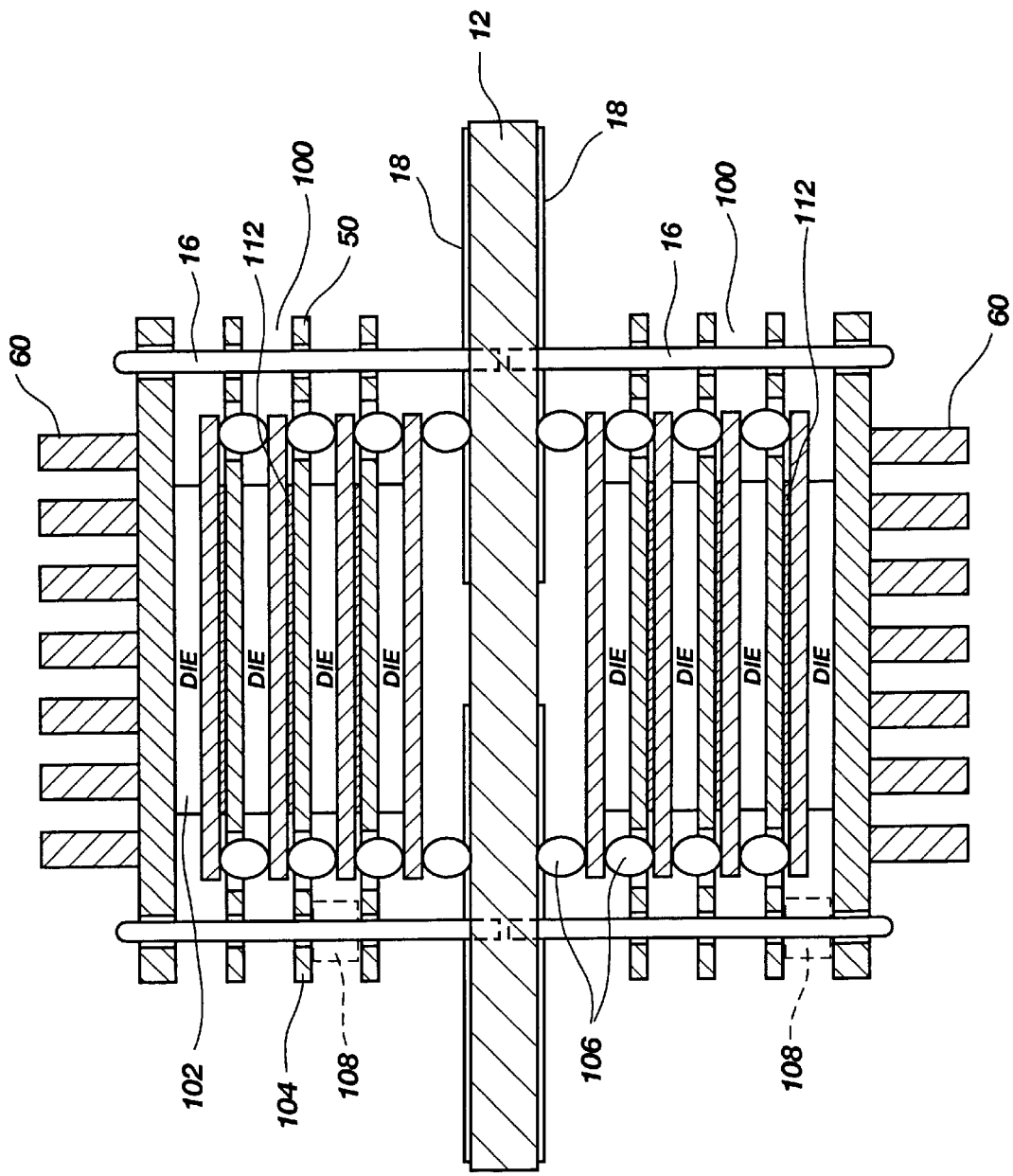
FIG. 4 is a view of fourth embodiment of the present invention.

Referring to drawing FIG. 4, a fourth embodiment 40 of the present invention is illustrated. The fourth embodiment 40 of the present invention comprises vertically stacked assemblies 100 as described hereinbefore on substrate 12 using alignment pins 16. The assemblies 100 are in contact with heat transfer plates 50 and heat transfer members 60. If desired, annular heat transfer members 108 (show in dotted lines) may be used as well as heat transfer spacers 112 (shown in dotted lines) as described hereinbefore for the transfer of heat from semiconductor devices 102 during operation.

Figure 5:
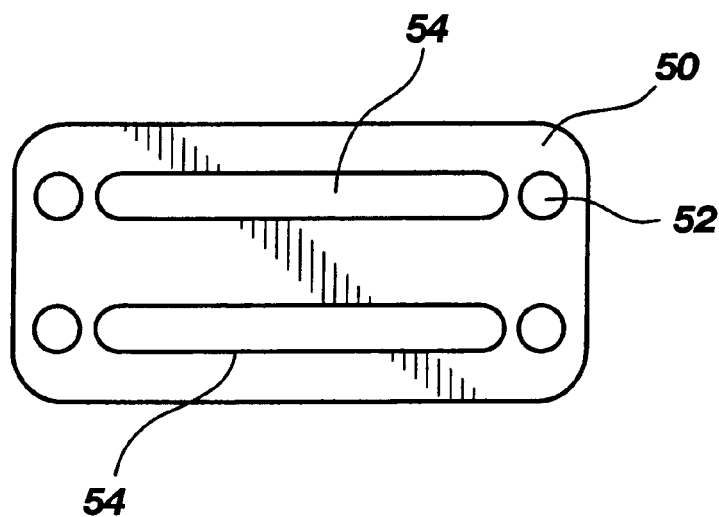
FIG. 5 is a top view of a heat transfer member of the present invention.

Referring to drawing FIG. 5, a heat transfer plate 50 is illustrated. The heat transfer plate 50 is generally rectangular in shape having alignment holes 52 therethrough and having elongated slots 54 therein. The heat transfer plate 50 may be of any desired thickness sufficient for the effective heat transfer from semiconductor device 102 (not shown) in contact therewith.

Figure 6:
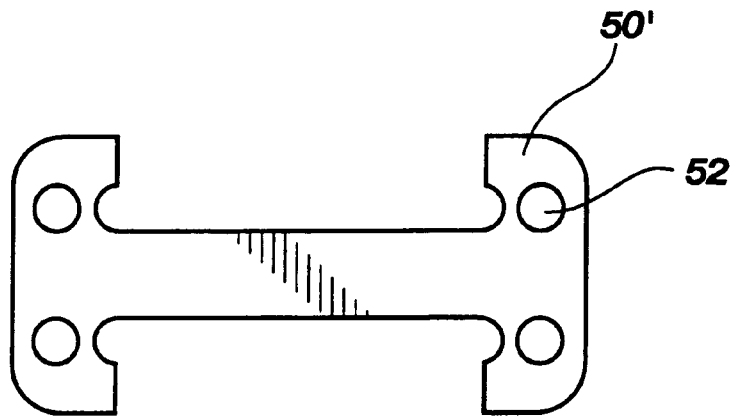
FIG. 6 is a top view of an alternative heat transfer member of the present invention.

Referring to drawing FIG. 6, an alternative heat transfer member 50' is illustrated, The alternative heat transfer member 50' is generally shaped having the crossbars of the T's located at each end and the stems of the T's joined with alignment apertures 52 formed therein. In this manner, additional clearance for the reflowed solder balls 106 is provided.

Figure 7:
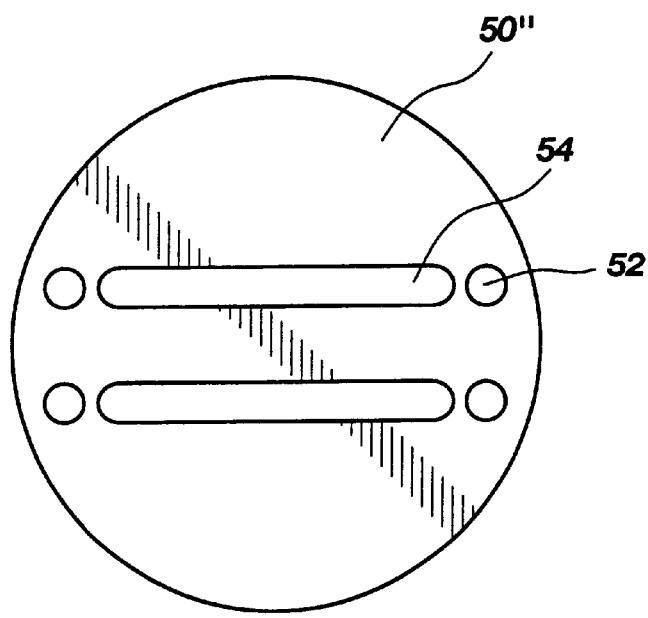
FIG. 7 is a top view of an alternative heat transfer member of the present invention.

Referring to drawing FIG. 7, another alternative heat transfer member 50" is illustrated. The heat transfer member 50" is generally circular in shape having alignment apertures 52 therein and elongated slots 54 formed therein. The circular shape of the heat transfer member 50" provides additional material for the transfer of heat away from the semiconductor device 102 (not shown) which contacts the member 50".

Figure 8:
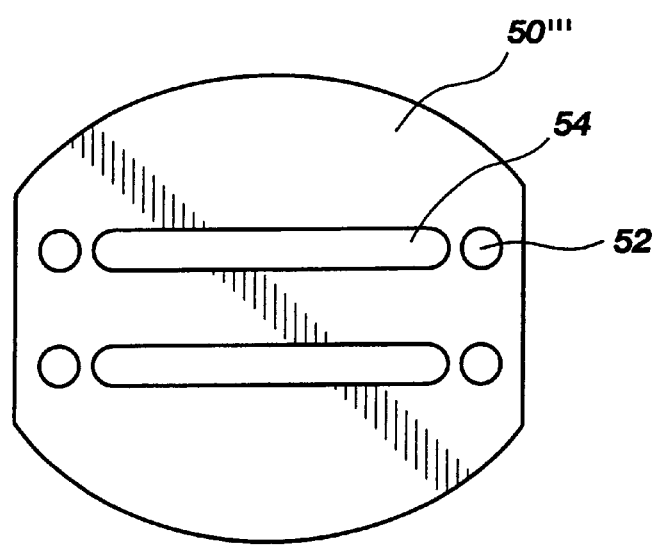
FIG. 8 is a top view of an alternative heat transfer member of the present invention.

Referring to drawing FIG. 8, yet another alternative heat transfer member 50''' is illustrated. The heat transfer member 50''' is generally elipical in shape having alignment apertures 52 therein and elongated slots 54 formed therein. The circular shape of the heat transfer member 50''' provides additional material for the transfer of heat away from the semiconductor device 102 (not shown) which contacts the member 50'''.

Figure 9:
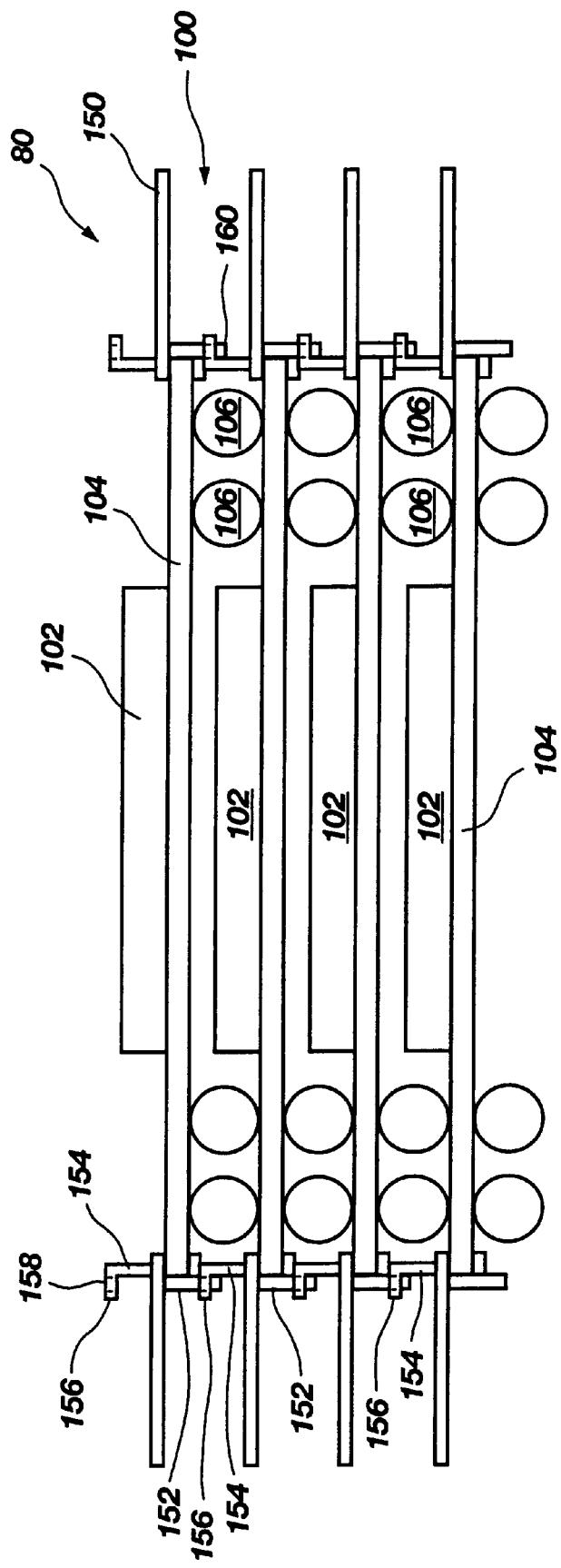
FIG. 9 is a view of a fifth embodiment of the present invention.

Referring to drawing FIG. 9, a fifth embodiment 80 of the present invention is illustrated. The fifth embodiment 80 includes a plurality of vertically stacked assemblies 100. Each assembly 100 includes a semiconductor device 102 mounted on a substrate 104 as described hereinbefore. Each assembly 100 being electrically and mechanically connected to an adjacent assembly 100 by means of reflowed solder balls 106 extending therebetween. Each substrate 104 of the assembly 100 having circuits thereon, circuits therein, and vias extending therethrough, as required, to make electrical contact as required with the semiconductor device 102. Surrounding each substrate 104 is a heat transfer member 150. Each assembly 100 is contained or installed or has extending therearound a heat transfer member 150. The heat transfer member 150 comprises a member of suitable metal having downwardly extending retention T-shaped flanges 152, upon a portion of which a substrate 104 sits, and upwardly extending L-shaped members 154, the upper portion 156 serving as support for the assembly 100 located thereabove having a heat transfer member 150 located therearound. The portion 156 of L-shaped members 154 having an area 158 into which lower portion 160 of retention T-shaped flanges 152 extends to locate, position, and retain the heat transfer member 150 in position with respect to an adjacent heat transfer member 150 as well as locating and positioning the assembly 100 within the heat transfer member 150 with respect to an adjacent assembly 100 in its heat transfer member 150.

Figure 10:
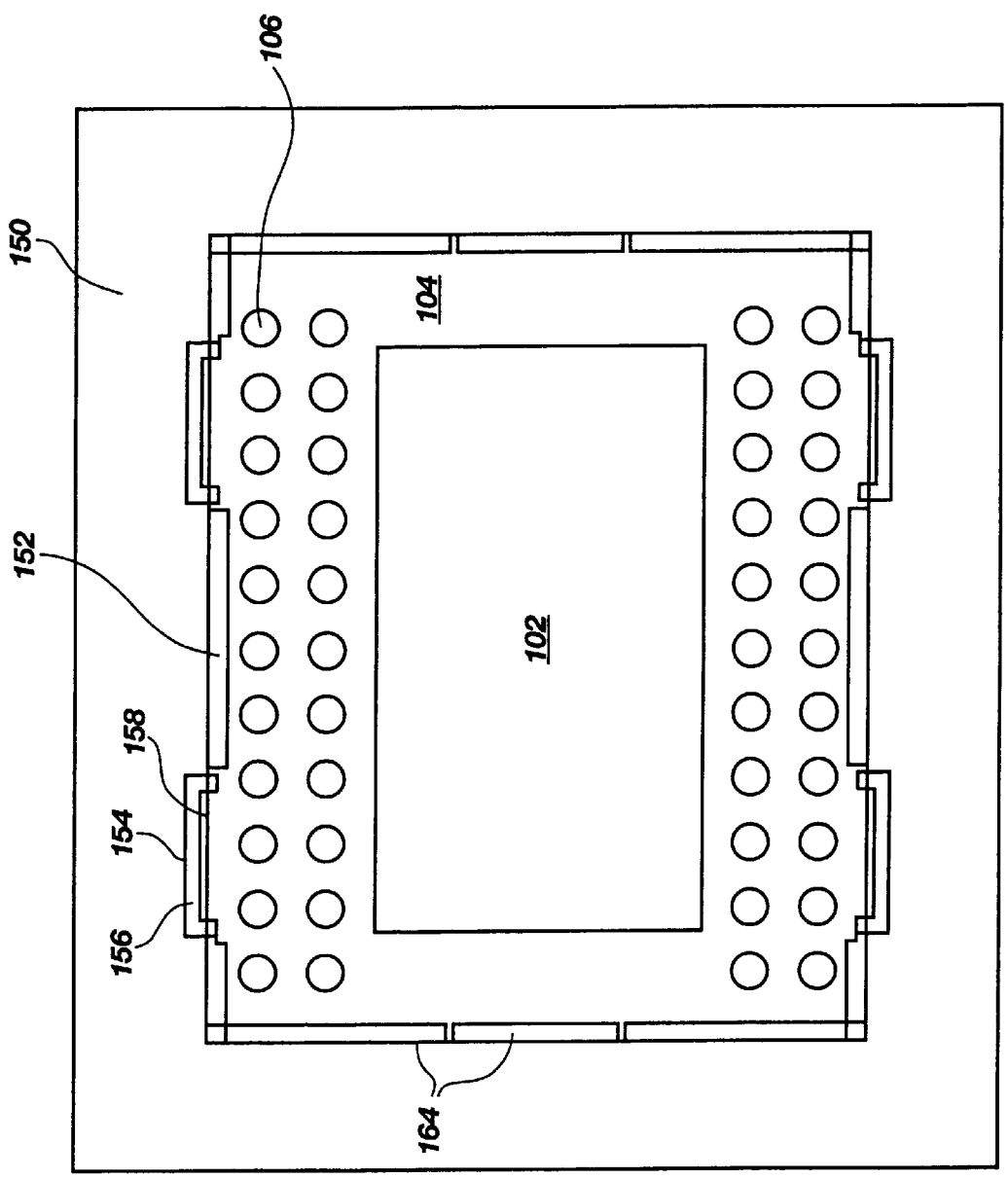
FIG. 10 is a top view of the fifth embodiment of the present invention.

Referring to drawing FIG. 10, an assembly 100 having heat transfer member 150 located therearound is illustrated. In addition to retention T-shaped flanges 152 and L-shaped members 154 retaining the assembly 100 in the heat transfer member 150, additional L-shaped members 164 are used on the other sides of the heat transfer member 150, not illustrated in drawing FIG. 9, to retain the substrate 104 of the assembly 100 in position in the heat transfer member 150. Some of the additional L-shaped members 164 extend over or above the assembly 100 while other L-shaped members 164 extend therebelow to act as a ledge or support for the substrate 104 of the assembly 100 when it is installed in the heat transfer member 150. As illustrated, the reflowed solder balls 106 extend in two rows along two portions of the substrate 104.

Figure 11:
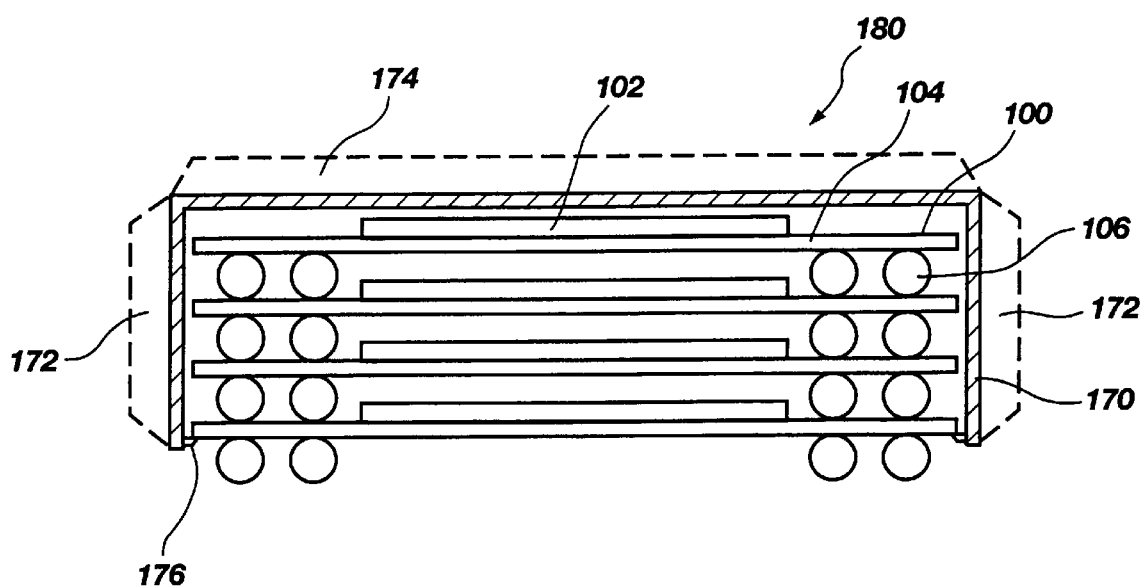
FIG. 11 is a view of the sixth embodiment of the present invention.

Referring to drawing FIG. 11, a sixth embodiment 180 of the present invention is illustrated. The sixth embodiment 180 includes a plurality of assemblies 100 comprising substrates 104 having semiconductor devices 102 thereon, each substrate 104 being electrically and mechanically connected to an adjacent substrate 104 by reflowed solder balls 106 extending therebetween. The plurality of assemblies 100 are contained within an enclosure 170 having a plurality of vertical heat transfer fins 172 thereon and a plurality of horizontal heat transfer fins 174 extending thereacross. The lowermost assembly 100 is formed having substantially the same shape as opening 178 of the enclosure 170 so that the plurality of assemblies 100 may be retained therein, except for the bottom of the substrate 104 of the lowermost assembly 100 and the solder reflowed balls 106 thereon, and a seal 176 is used to sealingly engage the substrate 104 and enclosure 170 to form an enclosed, lead free member. The enclosure 170 may be made of any suitable material, such as metal, plastic, etc., and may be of any desired suitable geometric shape. Any desired number of heat fins 172 and 174 may be used on the enclosure 170. The heat transfer fins 172 and 174 may have any desired shape suitable for use on the enclosure 170. The heat transfer fins 172 and 174 may be integrally formed on the enclosure 170 or attached thereto using any desired suitable attachment devices, such as adhesives, soldering, etc. Any desired number of assemblies 100 may be used in the enclosure 170, as desired. The enclosure 170 may be filled with a suitable heat transfer fluid, such as thermal grease, oil, etc.

The present invention may include changes, additions, deletions, modifications which are within the scope of the invention.

What is claimed is:

1. An assembly comprising:
   a first substrate having a first surface, a second surface, a plurality of circuits thereon, at least one circuit located on the first surface and the second surface;
   a first semiconductor device located on the first surface of the first substrate, the semiconductor device having a first surface, a second surface, and a periphery, the second surface of the semiconductor device connected to the first surface of the first substrate;
   a second substrate having a first surface, a second surface, at least one circuit located on the first surface thereof, at least one aperture therein, and at least one alignment pin having a portion thereof secured in a portion of the at least one aperture;
   a first heat transfer device having at least one aperture therein and at least one slot therein, the first heat transfer device in contact with a portion of the first semiconductor device, the at least one alignment pin of the second substrate extending through the at least one aperture in the first heat transfer device; and
   at least one connector extending between a circuit on the second surface of the first substrate and a circuit on the first surface of the second substrate.

2. The assembly of claim 1, further comprising:
   a third substrate having a first surface, a second surface, a plurality of circuits thereon, at least one circuit located on the first surface and the second surface;
   a second semiconductor device located on the first surface of the third substrate; and at least one connector extending between a circuit on the first surface of the first substrate and a circuit on the second surface of the third substrate, the connector extending through the at least one slot in the first heat transfer device.

3. The assembly of claim 2, further comprising:

a second heat transfer device in contact with the first surface of the second semiconductor device, the second heat transfer device having at least one aperture therein, the at least one alignment pin of the second substrate having a portion thereof extending into the at least one aperture in the second heat transfer device.

4. The assembly of claim 2, further comprising:

a third heat transfer device, the third heat transfer device in contact with a portion of the second surface of the third substrate and a portion of the first surface of the first heat transfer device.

5. The assembly of claim 2, further comprising:

a fourth substrate having a first surface, a second surface, a plurality of circuits thereon, at least one circuit located on the first surface and the second surface;

a third semiconductor device located on the first surface of the fourth substrate;

another first heat transfer device having at least one aperture therein and at least one slot therein, the another first heat transfer device connected to the fourth substrate, the at least one alignment pin of the second substrate extending through the at least one aperture in the another first heat transfer device;

at least one connector extending between a circuit on the first surface of the third substrate and a circuit on the second surface of the fourth substrate, the connector extending through the at least one slot in the another first heat transfer device; and a fourth heat transfer device located on the at least one alignment pin of the second substrate, the fourth heat transfer device located between the first heat transfer device and the another heat transfer device.

6. The assembly of claim 3, wherein the second heat transfer device includes fins thereon.

7. An assembly comprising:

a first substrate having a first surface, a second surface, a plurality of circuits thereon, at least one circuit located on the first surface and the second surface;

a first semiconductor device located on the first surface of the first substrate, the semiconductor device having a first surface, a second surface, and a periphery, the second surface of the semiconductor device connected to the first surface of the first substrate;

a first heat transfer device having at least one aperture therein and at least one slot therein, the first heat transfer device in contact with a portion of the first semiconductor device, said first heat transfer device extending substantially parallel and outwardly beyond a periphery of said first substrate;

at least one connector connected to a circuit on the second surface of the first substrate;

a second substrate having a first surface, a second surface, a plurality of circuits thereon, at least one circuit located on the first surface and the second surface;

a second semiconductor device located on the first surface of the second substrate, the second semiconductor device having a first surface, a second surface, and a periphery, the second surface of the second semiconductor device connected to the first surface of the second substrate; and at least one first connector extending between a circuit on the first surface of the first substrate and a circuit on the second surface of the second substrate, the at least one connector extending through the at least one slot in the first heat transfer device.

8. The assembly of claim 7, further comprising:

a second heat transfer device having at least one aperture therein and at least one slot therein, the second heat transfer device in contact with a portion of the second semiconductor device.

9. The assembly of claim 7, wherein the first heat transfer device includes at least one T-shaped portion and at least one L-shaped portion.

10. The assembly of claim 9, wherein a portion of the at least one T-shaped portion of the first heat transfer device retains a portion of the first substrate therein.

11. The assembly of claim 10, wherein a portion of the at least one L-shaped portion of the first heat transfer device retains a portion of the first substrate therein.

12. An assembly comprising:

a first substrate having a first surface, a second surface, a plurality of circuits thereon, at least one circuit located on the first surface and the second surface;

a first semiconductor device located directly on the first surface of the first substrate, the semiconductor device having a first surface, a second surface, and a periphery, the second surface of the semiconductor device connected to the first surface of the first substrate;

at least one connector connected to a circuit on the second surface of the first substrate;

a second substrate having a first surface, a second surface, a plurality of circuits thereon, at least one circuit located on the first surface and the second surface;

a second semiconductor device located on the first surface of the second substrate, the second semiconductor device having a first surface, a second surface, and a periphery, the second surface of the second semiconductor device connected to the first surface of the second substrate;

at least one first connector connected to a circuit on the second surface of the first substrate;

at least one second connector connected to a circuit on the first surface of the first substrate and a circuit on the second surface of the second substrate; and an enclosure containing the first substrate and the second substrate therein, the enclosure having a portion thereof sealingly engaging a portion of the first substrate.

13. The assembly of claim 12, further comprising:

at least one fin connected to a portion of the enclosure.

14. A semiconductor device assembly comprising:

a first substrate having a first surface, a second surface, a plurality of circuits thereon, at least one circuit located on the first surface and the second surface;

a first semiconductor device located on the first surface of the first substrate, the semiconductor device having a first surface, a second surface, and a periphery, the second surface of the first semiconductor device connected to the first surface of the first substrate;

a second substrate having a first surface, a second surface, at least one circuit located on the first surface thereof, at least one aperture therein, and at least one alignment pin having a portion thereof secured in a portion of the at least one aperture;

a first heat transfer member having at least one aperture therein and at least one slot therein, the first heat transfer member in contact with a portion of the first semiconductor device, the at least one alignment pin of the second substrate configured to extend through the at least one aperture in the first heat transfer member; and at least one connector extending between a circuit on the second surface of the first substrate and a circuit on the first surface of the second substrate.

15. The semiconductor device assembly of claim 14, further comprising:

a third substrate having a first surface, a second surface, a plurality of circuits thereon, at least one circuit located on the first surface and the second surface;

a second semiconductor device located on the first surface of the third substrate; and at least one connector extending between a circuit on the first surface of the first substrate and a circuit on the second surface of the third substrate, the at least one connector extending through the at least one slot in the first heat transfer member.

16. The semiconductor device assembly of claim 15, further comprising:

a second heat transfer member in contact with the first surface of the second semiconductor member, the second heat transfer device having at least one aperture therein, the at least one alignment pin of the second substrate having a portion thereof extending into the at least one aperture in the second heat transfer member.

17. The semiconductor device assembly of claim 15, further comprising:

a third heat transfer member, the third heat transfer member in contact with a portion of the second surface of the third substrate and a portion of the first surface of the first heat transfer member.

18. The semiconductor device assembly of claim 15, further comprising:

a fourth substrate having a first surface, a second surface, a plurality of circuits thereon, at least one circuit located on the first surface and the second surface;

a third semiconductor device located on the first surface of the fourth substrate;

another first heat transfer member having at least one aperture therein and at least one slot therein, the another first heat transfer member connected to the fourth substrate, the at least one alignment pin of the second substrate extending through the at least one aperture in the another first heat transfer member;

at least one connector extending between a circuit on the first surface of the third substrate and a circuit on the second surface of the fourth substrate, the at least one connector extending through the at least one slot in the another first heat transfer member; and a fourth heat transfer member located on the at least one alignment pin of the second substrate, the fourth heat transfer member located between the first heat transfer member and the another heat transfer member.

19. The semiconductor device assembly of claim 16, wherein the second heat transfer member includes fins thereon.

20. A semiconductor device assembly comprising:

a first substrate having a first surface, a second surface, a plurality of circuits thereon, at least one circuit located on the first surface and the second surface;

a first semiconductor device located on the first surface of the first substrate, the semiconductor device having a first surface, a second surface, and a periphery, the second surface of the semiconductor device connected to the first surface of the first substrate;

a first heat transfer member having at least one aperture therein and at least one slot therein, the first heat transfer member in contact with a portion of the first semiconductor device, said first heat transfer member configured to extend substantially parallel and outwardly beyond a periphery of said first substrate;

at least one connector connected to a circuit on the second surface of the first substrate;

a second substrate having a first surface, a second surface, a plurality of circuits thereon, at least one circuit located on the first surface and the second surface;

a second semiconductor device located on the first surface of the second substrate, the second semiconductor device having a first surface, a second surface, and a periphery, the second surface of the semiconductor device connected to the first surface of the second substrate; and at least one first connector is connected to a circuit on the first surface of the first substrate and a circuit on the second surface of the second substrate, the at least one connector configured to extend through the at least one slot in the first heat transfer member.

21. The semiconductor device assembly of claim 20, further comprising:

a second heat transfer member having at least one aperture therein and at least one slot therein, the second heat transfer member in contact with a portion of the second semiconductor device.

22. The semiconductor device assembly of claim 20, wherein the first heat transfer member includes at least one T-shaped portion and at least one L-shaped portion.

23. The semiconductor device assembly of claim 22, wherein a portion of the at least one T-shaped portion of the first heat transfer member retains a portion of the first substrate therein.

24. The semiconductor device assembly of claim 23, wherein a portion of the at least one L-shaped portion of the first heat transfer member retains a portion of the first substrate therein.

25. The semiconductor device assembly of claim 20, wherein the first heat transfer member includes at least one circular shaped heat transfer member.

26. The semiconductor device assembly of claim 20, wherein the first heat transfer member includes at least one elliptical shaped heat transfer member.

27. A semiconductor device assembly comprising:

a first substrate having a first surface, a second surface, a plurality of circuits thereon, at least one circuit located on the first surface and the second surface;

a first semiconductor device directly contacting the first surface of the first substrate, the semiconductor device having a first surface, a second surface, and a periphery, the second surface of the first semiconductor device connected to the first surface of the first substrate;

at least one connector connected to a circuit on the second surface of the first substrate;

a second substrate having a first surface, a second surface, a plurality of circuits thereon, at least one circuit located on the first surface and the second surface;

a second semiconductor device located on the first surface of the second substrate, the second semiconductor device having a first surface, a second surface, and a periphery, the second surface of the second semiconductor device connected to the first surface of the second substrate;

at least one first connector connected to a circuit on the second surface of the first substrate;

at least one second connector connected to a circuit on the first surface of the first substrate and a circuit on the second surface of the second substrate; and an enclosure configured to contain the first substrate and the second substrate therein, the enclosure having a portion thereof configured to sealingly engage a portion of the first substrate.

28. The semiconductor device assembly of claim 27, further comprising: at least one fin connected to a portion of the enclosure.

29. A semiconductor device assembly comprising:

a first substrate having a first surface, a second surface, a plurality of circuits thereon, at least one circuit located on the first surface and the second surface;

a first semiconductor device located on the first surface of the first substrate, the first semiconductor device having a first surface, a second surface, and a periphery, the second surface of the first semiconductor device connected to the first surface of the first substrate;

a second substrate having a first surface, a second surface, at least one circuit located on the first surface thereof, at least one aperture therein, and at least one alignment pin having a portion thereof secured in a portion of the at least one aperture;

a first heat transfer device having at least one aperture therein and at least one slot therein, the first heat transfer device in contact with a portion of the first semiconductor device, the at least one alignment pin of the second substrate extending through the at least one aperture in the first heat transfer device;

at least one connector extending between a circuit on the second surface of the first substrate and a circuit on the first surface of the second substrate;

a second semiconductor device located on the first surface of the second substrate, the second semiconductor device having a first surface, a second surface, and a periphery, the second surface of the second semiconductor device connected to the first surface of the second substrate;

a third substrate having a first surface, a second surface, at least one circuit located on the first surface thereof;

a second heat transfer device having at least one aperture therein and at least one slot therein, the second heat transfer device in contact with a portion of the second semiconductor device, the at least one alignment pin of the second substrate extending through the at least one aperture in the second heat transfer device; and at least one connector extending between a circuit on the second surface of the third substrate and a circuit on the first surface of the first substrate.

30. The semiconductor device assembly of claim 29, further comprising:

a fourth substrate having a first surface, a second surface, a plurality of circuits thereon, at least one circuit located on the first surface and the second surface;

a third semiconductor device located on the first surface of the fourth substrate; and at least one connector extending between a circuit on the first surface of the third substrate and a circuit on the second surface of the fourth substrate, the at least one connector extending through the at least one slot in the second heat transfer device.

31. The semiconductor device assembly of claim 30, further comprising:

a third heat transfer device in contact with the first surface of the third semiconductor device, the third heat transfer device having at least one aperture therein, the at least one alignment pin of the second substrate having a portion thereof extending into the at least one aperture in the third heat transfer device.

32. The semiconductor device assembly of claim 31, further comprising:

a fourth heat transfer device, the fourth heat transfer device in contact with a portion of the second surface of the fourth substrate and a portion of the first heat transfer device.

33. The semiconductor device assembly of claim 31, further comprising:

a fifth substrate having a first surface, a second surface, a plurality of circuits thereon, at least one circuit located on the first surface and the second surface;

a fourth semiconductor device located on the first surface of the fifth substrate;

another first heat transfer device having at least one aperture therein and at least one slot therein, the another first heat transfer device connected to the fourth semiconductor device, the at least one alignment pin of the second substrate extending through the at least one aperture in the another first heat transfer device;

at least one connector extending between a circuit on the first surface of the fourth substrate and a circuit on the second surface of the fifth substrate, the at least one connector extending through the at least one slot in the third heat transfer device; and a fourth heat transfer device located on the at least one alignment pin of the second substrate, the fourth heat transfer device located between the first heat transfer device and the another first heat transfer device.

34. The semiconductor device assembly of claim 33, wherein the another first heat transfer device includes fins thereon.

* * * * *

UNITED STATES PATENT AND TRADEMARK OFFICE
CERTIFICATE OF CORRECTION

PATENT NO.      : 6,297,960 B1                                    Page 1 of 1
DATED           : October 2, 2001
INVENTOR(S)     : Walter L. Moden et al.

It is certified that error appears in the above-identified patent and that said Letters Patent is hereby corrected as shown below:

Column 1,
Lines 33-34, change "wore-bond" to -- wire-bond --
Line 58, change "die" to -- dice --

Column 2,
Line 6, change "die" to -- dice --

Column 5,
Line 22, change "elipical" to -- elliptical --

Column 6,
Line 19, change "solder reflowed" to -- reflowed solder --

Column 9,
Line 23, after "semiconductor" change "member" to -- device --
Line 24, after "transfer" change "device" to -- member --

Column 10,
Line 22, after "one" insert -- first --

Signed and Sealed this

Eighth Day of April, 2003

JAMES E. ROGAN
*Director of the United States Patent and Trademark Office*